United States Patent
Phillips

(10) Patent No.: US 7,238,252 B2
(45) Date of Patent: Jul. 3, 2007

(54) METHOD OF FORMING A OLED DONOR SHEET HAVING RIGID EDGE FRAME

(75) Inventor: Bradley A. Phillips, Honeoye Falls, NY (US)

(73) Assignee: Eastman Kodak Company, Rochester, NY (US)

( * ) Notice: Subject to any disclaimer, the term of this patent is extended or adjusted under 35 U.S.C. 154(b) by 484 days.

(21) Appl. No.: 10/790,995

(22) Filed: Mar. 2, 2004

(65) Prior Publication Data

US 2005/0194089 A1    Sep. 8, 2005

(51) Int. Cl.
*B32B 3/04* (2006.01)

(52) U.S. Cl. .................. 156/216; 156/227; 428/126

(58) Field of Classification Search .............. 156/202, 156/216, 478, 479; 428/123, 124, 126
See application file for complete search history.

(56) References Cited

U.S. PATENT DOCUMENTS

| | | | |
|---|---|---|---|
| 2,556,787 A * | 6/1951 | Bach et al. ................ | 156/363 |
| 3,074,832 A * | 1/1963 | Graff ......................... | 428/38 |
| 5,473,995 A | 12/1995 | Gottlieb | |
| 5,688,551 A | 11/1997 | Littman et al. | |
| 5,742,129 A | 4/1998 | Nagayama et al. | |
| 5,851,709 A | 12/1998 | Grande et al. | |
| 5,937,272 A | 8/1999 | Tang | |
| 6,114,088 A | 9/2000 | Wolk et al. | |
| 6,140,009 A | 10/2000 | Wolk et al. | |
| 6,214,520 B1 | 4/2001 | Wolk et al. | |
| 6,221,553 B1 | 4/2001 | Wolk et al. | |

FOREIGN PATENT DOCUMENTS

| | | |
|---|---|---|
| EP | 0 883 190 | 12/1998 |
| EP | 1 028 001 | 8/2000 |
| EP | 1 321 303 | 6/2003 |
| EP | 1 321 988 | 6/2003 |
| GB | 1079059 | 8/1967 |

\* cited by examiner

*Primary Examiner*—Richard Crispino
*Assistant Examiner*—Barbara J. Musser
(74) *Attorney, Agent, or Firm*—Raymond L. Owens

(57) ABSTRACT

A method of operating on a flexible donor sheet, before or after organic material has been transferred to such sheet, to form a rigid edge frame to facilitate its mounting, including cutting notches in each of the four corners of the sheet, and folding the four notched edge portions of the sheet and securing the folded portions to the main body of the sheet to form at least four rigid edges so as to provide a rigid edge frame which can be readily mounted in an OLED device manufacturing process.

5 Claims, 8 Drawing Sheets

METHOD OF FORMING A OLED DONOR SHEET HAVING RIGID EDGE FRAME

CROSS REFERENCE TO RELATED APPLICATIONS

Reference is made to commonly assigned U.S. patent application Ser. No. 10/021,410 filed Dec. 12, 2001, entitled "Apparatus for Permitting Transfer of Organic Material From a Donor to Form a Layer in an OLED Device" by Bradley A. Phillips et al. and to commonly assigned U.S. patent application Ser. No. 10/791,010 filed Mar. 3, 2004 by Bradley A. Phillips, entitled "Mounting an OLED Donor Sheet to Frames", the disclosures of which are herein incorporated by reference.

FIELD OF THE INVENTION

The present invention relates to a making a donor sheet rigid for use in the manufacture of OLED devices.

BACKGROUND OF THE INVENTION

In color or full-color organic electroluminescent (EL) displays having an array of colored pixels such as red, green, and blue color pixels (commonly referred to as RGB pixels), precision patterning of the color-producing organic EL media is required to produce the RGB pixels. The basic EL device has in common an anode, a cathode, and an organic EL medium sandwiched between the anode and the cathode. The organic EL medium can include one or more layers of organic thin films, where one of the layers or regions within a layer is primarily responsible for light generation or electroluminescence. This particular layer is generally referred to as the light-emitting layer of the organic EL medium. Other organic layers present in the organic EL medium commonly facilitate electronic transportation, and are referred to as either the hole-transporting layer (for hole conduction) or electron-transporting layer (for electron conduction). In forming the RGB pixels in a full-color organic EL display panel, it is necessary to devise a method to precisely pattern the emissive layer of the organic EL medium or the entire organic EL medium.

Typically, electroluminescent pixels are formed on the display by shadow masking techniques, such as shown in U.S. Pat. No. 5,742,129. Although this has been effective, it has several drawbacks. It has been difficult to achieve high resolution of pixel sizes using shadow masking. Moreover, there are problems of alignment between the substrate and the shadow mask, and care must be taken that pixels are formed in the appropriate locations. When it is desirable to increase the substrate size, it is difficult to manipulate the shadow mask to form appropriately positioned pixels. A further disadvantage of the shadow mask method is that the mask holes can become plugged with time. Plugged holes on the mask lead to the undesirable result of non-functioning pixels on the EL display.

There are further problems with the shadow mask method, which become especially apparent when making EL devices with dimensions of more than a few inches on a side. It is extremely difficult to manufacture larger shadow masks with the required precision (hole position of ±5 micrometers) for accurately forming EL devices.

A method for patterning high-resolution organic EL displays has been disclosed in U.S. Pat. No. 5,851,709 by Grande et al. This method is comprised of the following sequences of steps: 1) providing a donor substrate having opposing first and second surfaces; 2) forming a light-transmissive, heat-insulating layer over the first surface of the donor substrate; 3) forming a light-absorbing layer over the heat-insulating layer; 4) providing the donor substrate with an array of openings extending from the second surface to the heat-insulating layer; 5) providing a transferable, color-forming, organic donor layer formed on the light-absorbing layer; 6) precision aligning the donor substrate with the display substrate in an oriented relationship between the openings in the substrate and the corresponding color pixels on the device; and 7) employing a source of radiation for producing sufficient heat at the light-absorbing layer over the openings to cause the transfer of the organic layer on the donor substrate to the display substrate. A problem with the Grande et al. approach is that patterning of an array of openings on the donor substrate is required. This produces many of the same problems as the shadow mask method, including the requirement for precision mechanical alignment between the donor substrate and the display substrate. A further problem is that the donor pattern is fixed and cannot be changed readily.

Using an unpatterned donor sheet and a precision light source, such as a laser, can remove some of the difficulties seen with a patterned donor. Such a method is disclosed by Littman et al. in U.S. Pat. No. 5,688,551, and in a series of patents by Wolk et al. (U.S. Pat. Nos. 6,114,088; 6,140,009; 6,214,520; and 6,221,553).

In commonly assigned U.S. Pat. No. 5,937,272, Tang has taught a method of patterning multicolor pixels (e.g. red, green, and blue subpixels) onto a thin-film-transistor (TFT) array substrate by vapor deposition of an EL material. Such EL material can be precoated on one surface of a donor support material and transferred to a substrate by vapor deposition in a selected pattern (as in FIGS. 4, 5, and 6 in the aforementioned U.S. Pat. No. 5,937,272).

The EL material transfer is preferably done in a vacuum chamber such as disclosed in Tang describes in the aforementioned patent and, in particular, vacuum is preferably maintained between the donor and substrate. The donor and substrate must also be kept in close proximity during the EL transfer (less than 250 micrometers between the coating and raised portions of the substrate as taught by Tang). Furthermore, the donor can be in contact with the raised portions of the substrate and thereby maintain sufficient spacing between the coating and the recessed portions of the substrate where the EL material is deposited. In any case, a method of holding the donor and substrate in contact in a vacuum chamber while maintaining vacuum between the donor and substrate is required.

Isberg et al., in commonly assigned European Patent Application 1 028 001 A1, have disclosed the additional use of an adhesion-promoting layer between the donor layer and substrate. While this would help promote the close contact required by Tang, it would be disadvantageous because the adhesion-promoting layer can introduce impurities in the form of the adhesive.

Mechanical pressure, such as that applied by a manual plate, can be used but is difficult to maintain evenly over the entire surface for the micrometer-order tolerances needed. Pressure from air or other fluids would work better, but the use of such pressure is made difficult in that the conditions in the vacuum chamber need to remain undisturbed. Also, in using fluidic pressure to maintain close contact, lack of donor sheet flexibility can inhibit conformal close contact with the substrate surface while, at the same time, a flexible donor sheet can be difficult to handle and mount.

SUMMARY OF THE INVENTION

It is therefore an object of the present invention to provide a simplified way of mounting a flexible donor sheet prior to transfer of organic material to an OLED device.

This object is achieved by a method of operating on a flexible donor sheet, before or after organic material has been transferred to such sheet, to form a rigid edge frame to facilitate its mounting, comprising:

a) cutting notches in each of the four corners of the sheet; and b) folding the notched edge portions of the sheet and securing the folded portion to the main body of the sheet to form four rigid edges so as to provide a rigid edge frame which can be readily mounted in an OLED device manufacturing process.

ADVANTAGES

The present invention makes use of folding edges of the donor sheet to provide a rigid structure which thereby limits the need for a complex mounting arrangement.

BRIEF DESCRIPTION OF THE DRAWINGS

FIG. 7a shows how a wire frame can be used to enhance the rigidity of the folded donor sheet edges;

FIG. 7b shows in detail a folded edge of FIG. 7a; and

DETAILED DESCRIPTION OF THE INVENTION

Figure 1:
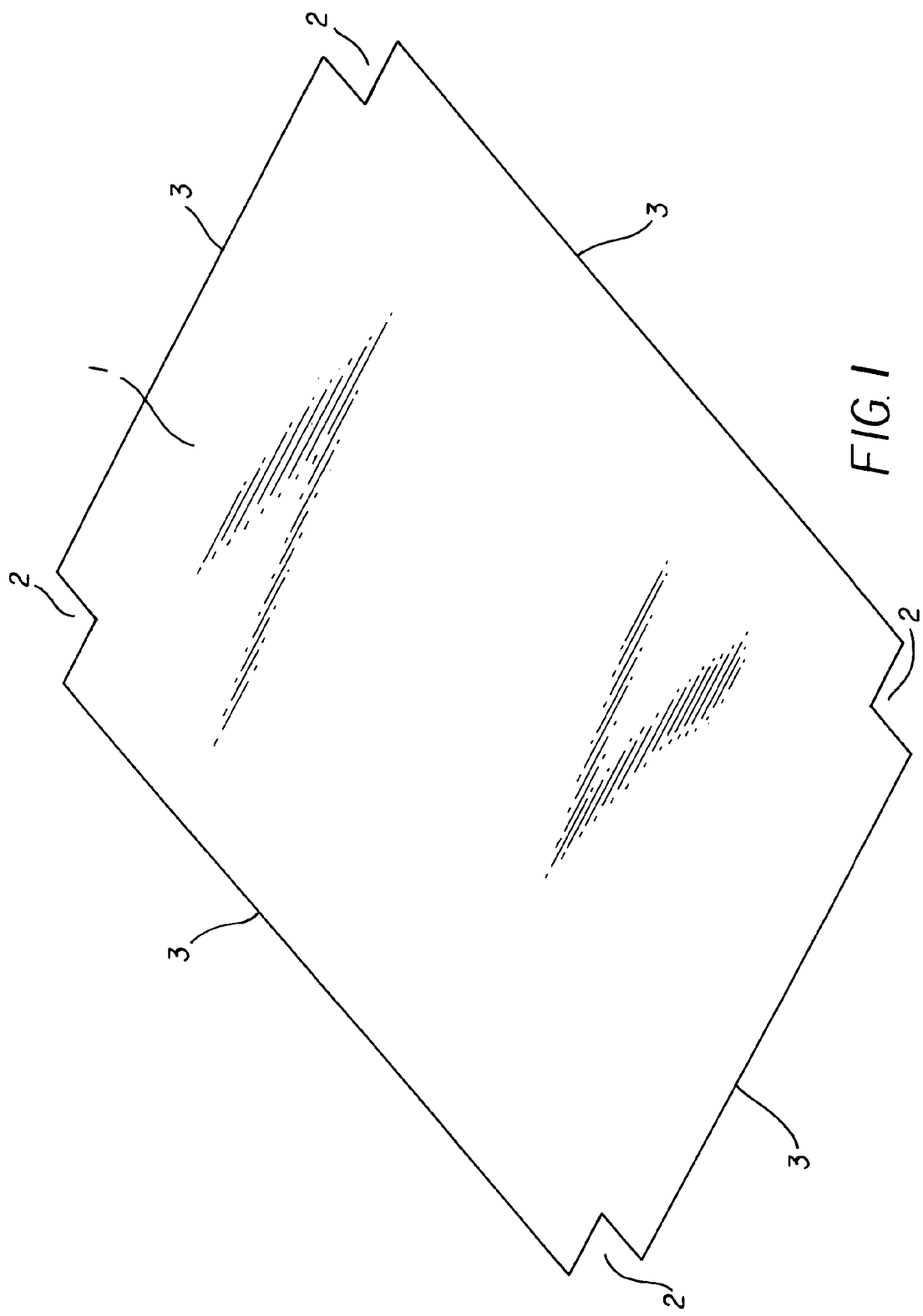
FIG. 1 is a perspective showing a donor sheet with pre-notched corners to enable folding of the edges.

Turning now to FIG. 1, donor sheet 1 is shown. It will be understood that the donor sheet 1 has previously had organic material formed on it or is capable of receiving organic material. The donor sheet 1 is mounted in an OLED manufacturing process that permits subsequent processing such as forming an electrode or protective layer. It will be understood that if the donor sheet 1 was formed prior to deposition of organic material, such material will have to be formed on the donor sheet 1 prior to subsequent manufacturing processes. This can be accomplished by transfer of the organic material to an OLED device generally by absorbing heat from a laser beam. Donor sheet 1 is capable of receiving a light absorbing layer prior to receiving organic material for producing heat. The donor sheet 1 typically is made of a thin flexible polymer material, such as Kapton® or Estar®. Flexibility is important to permit the donor sheet to more readily conform to the surface of an OLED device during the transfer of organic material. It also permits the donor material to be in web form for easier storage (as a roll) and upstream handling and processing. When donor sheet 1 is used for thermal transfer of organic materials, a laser beam impinges upon the sheet and a heat-absorbing layer converts the laser energy into heat which causes the transfer of the OLED material. The donor sheet 1 is shown formed with notched corners 2 to permit edges 3 to be folded in a way that produces a rigid structure along each edge to produce a rigid frame. Various types of different folded edge structures can be used to produce rigid edges. In accordance with the present invention, after the notches are cut and each of the four corners of the donor sheet 1, the notch edge portions of the donor sheet 1 are folded. They are secured to the main body of the sheet to form four rigid edges so as to provide a rigid edge frame which can be readily mounted in an OLED device manufacturing process.

Figure 2:
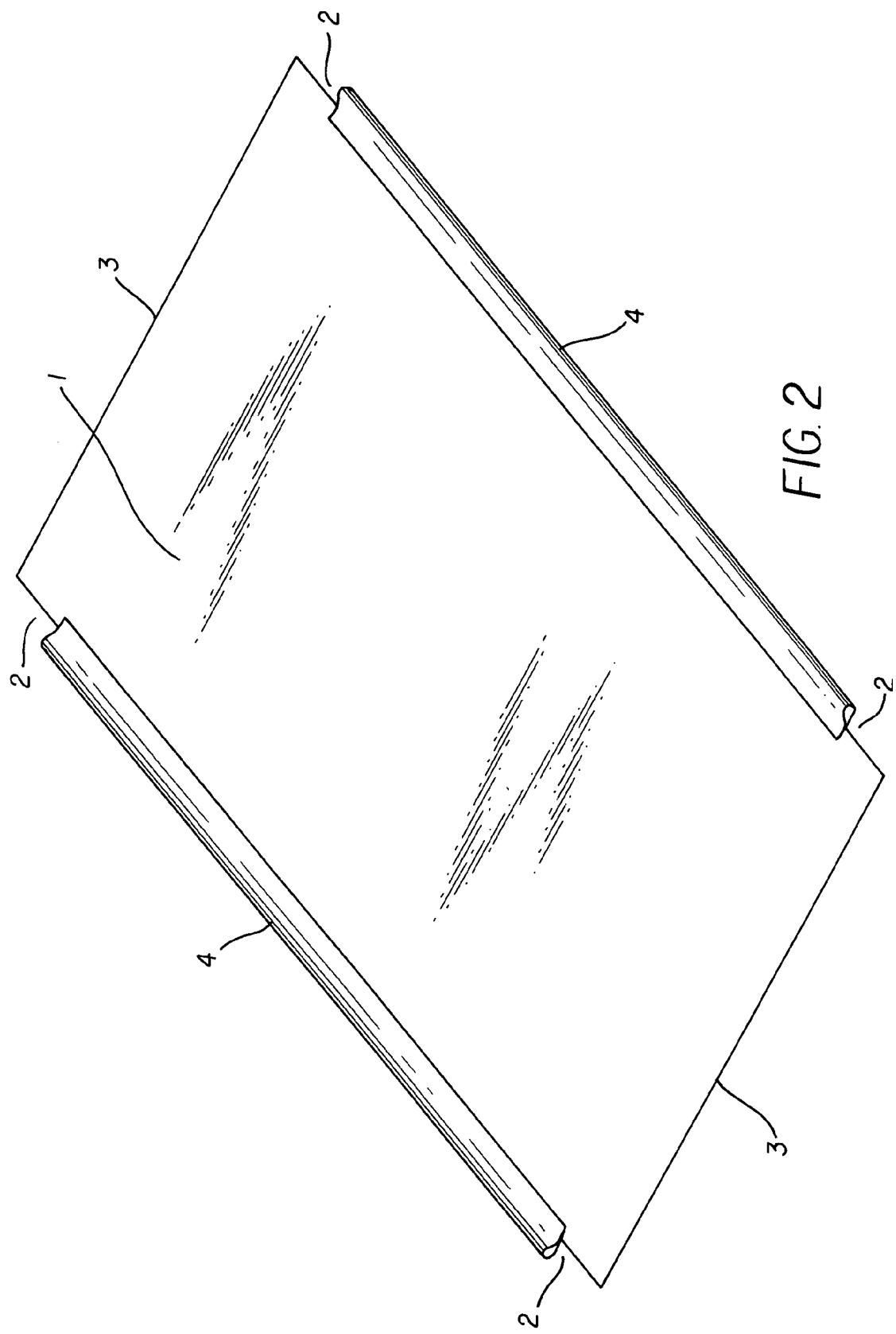
FIG. 2 is a perspective showing two edges of a donor sheet folded in a way that provides rigidity along the folded edges.

FIG. 2 shows, in more detail, the first step in providing a rigid frame around donor sheet 1 by forming two opposing edges 3 into folded edges 4. Folded edges 4 are held in place by adhesive or other fastening methods such as, for example, double-sided tape, heat tacking, ultrasonic welding, rivets, or clips. Other folded edge forms can be used in accordance with the present invention which employ creases to form a rigid edge.

Figure 3:
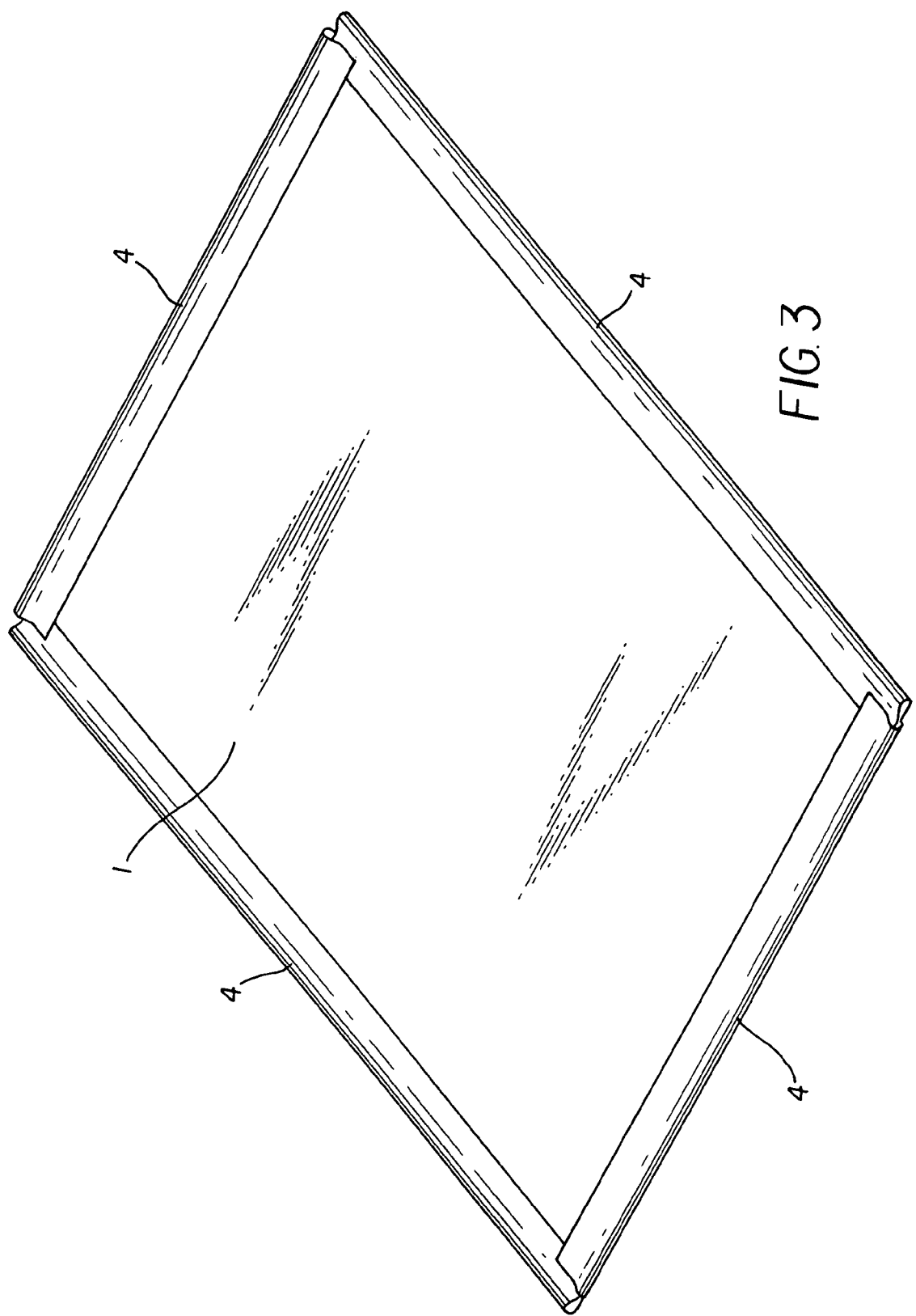
FIG. 3 is a perspective showing all four edges of the donor sheet folded in a way that provides a rigid frame around the entire sheet.
Figure 4:
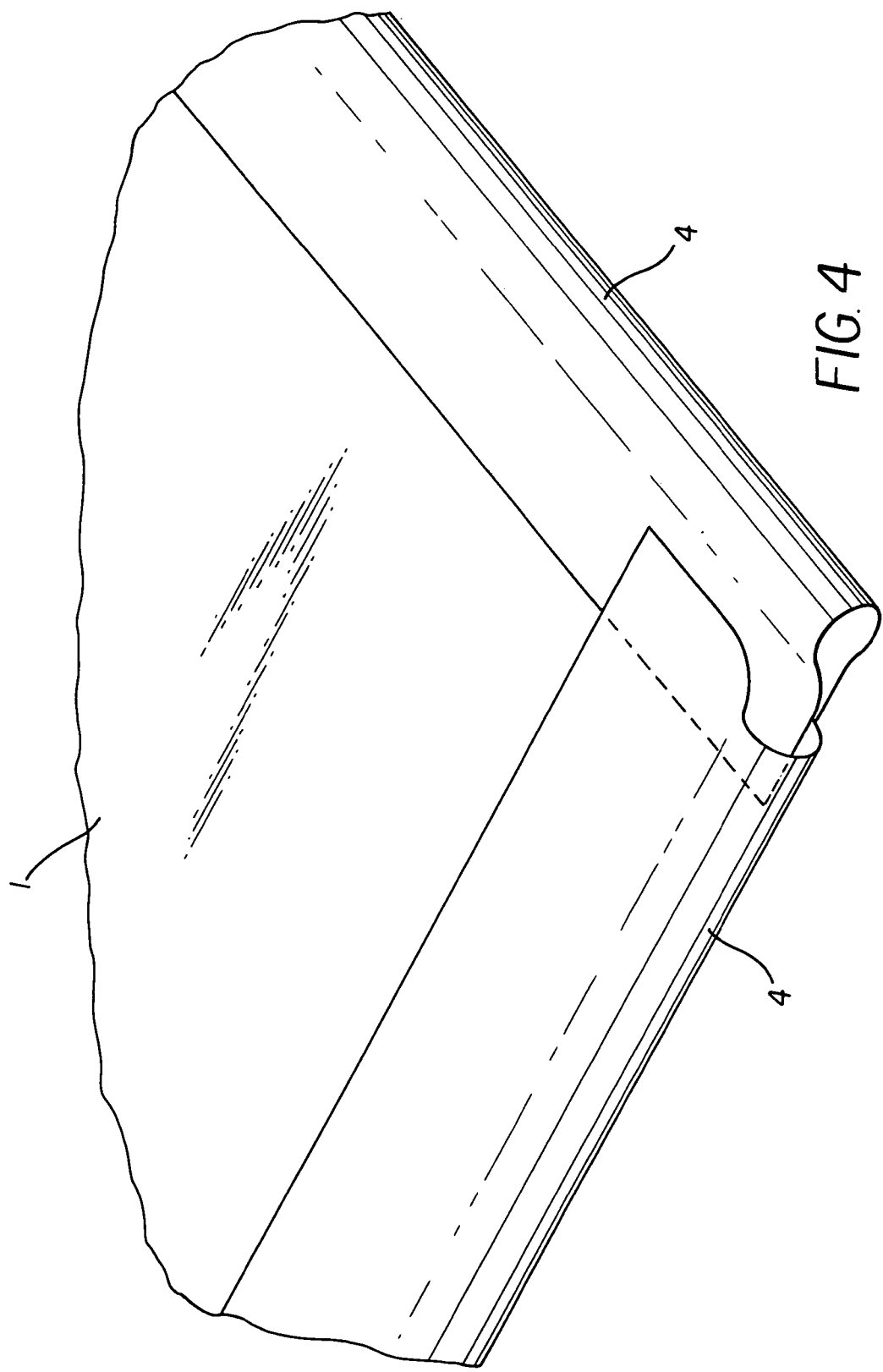
FIG. 4 is a detail perspective of FIG. 3 showing how the edges are folded.

FIG. 3 shows the remaining two edges 3 formed into folded edges 4 to form a complete rigid frame around the perimeter of donor sheet 1. The folding steps could also be done in a different order than described. This process could be done manually or various ways and levels of automation, such as by using forming bars. FIG. 4 shows a detail of folded edges 4 at one corner of donor sheet 1.

Figure 5:
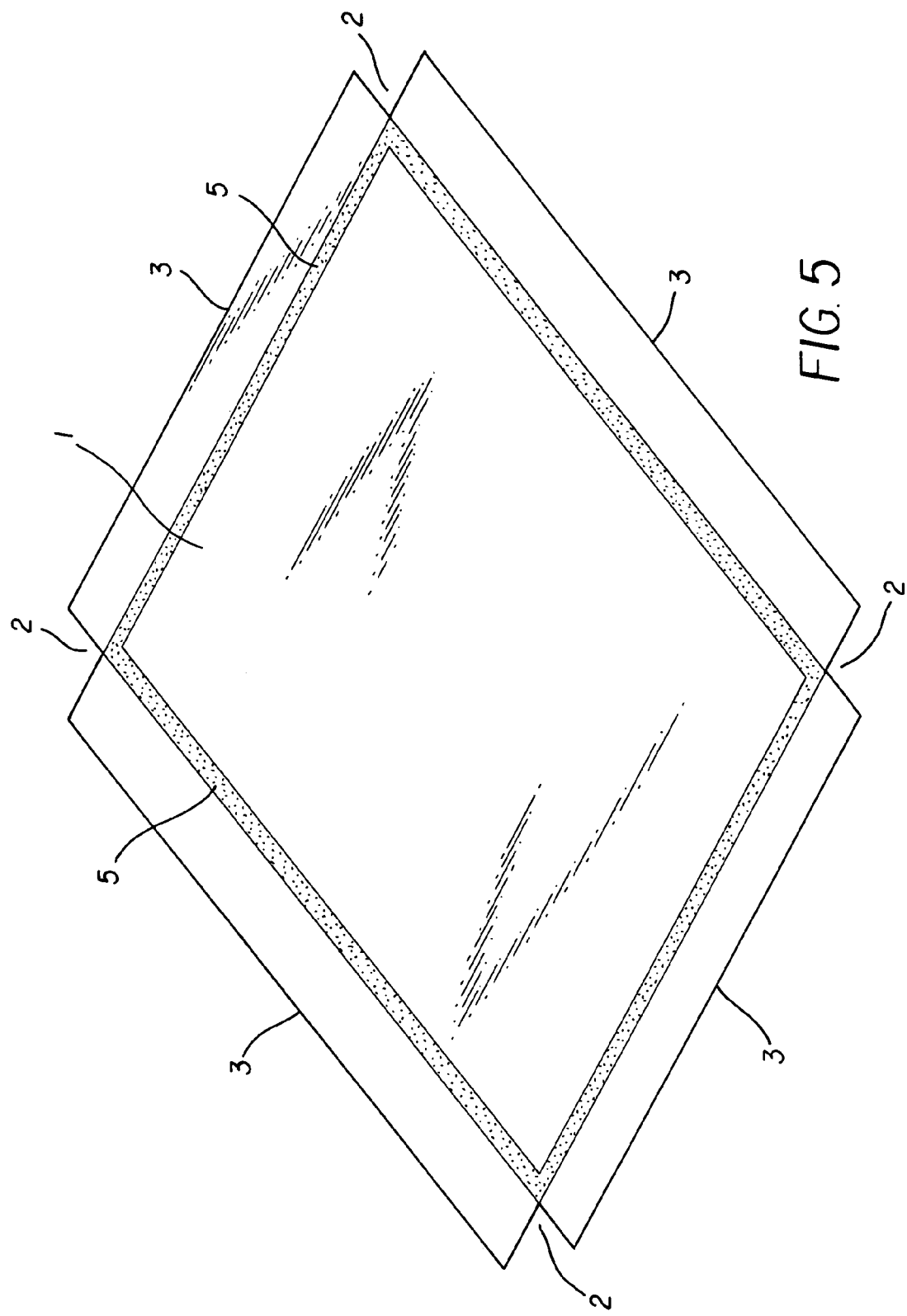
FIG. 5 shows the location where tape, adhesive, or other fasteners are applied to secure the folded edges to the main body of the sheet.

FIG. 5 shows the location of an attachment zone 5 on the main body of the donor sheet 1 where the fastening method for holding folded edges 4 is applied. Adhesives or double-sided tape could be applied to attachment zone 5 previous to forming folded edges 4 or, thermal or mechanical fastening, as described above, can be applied after forming folded edges 4.

Figure 6:
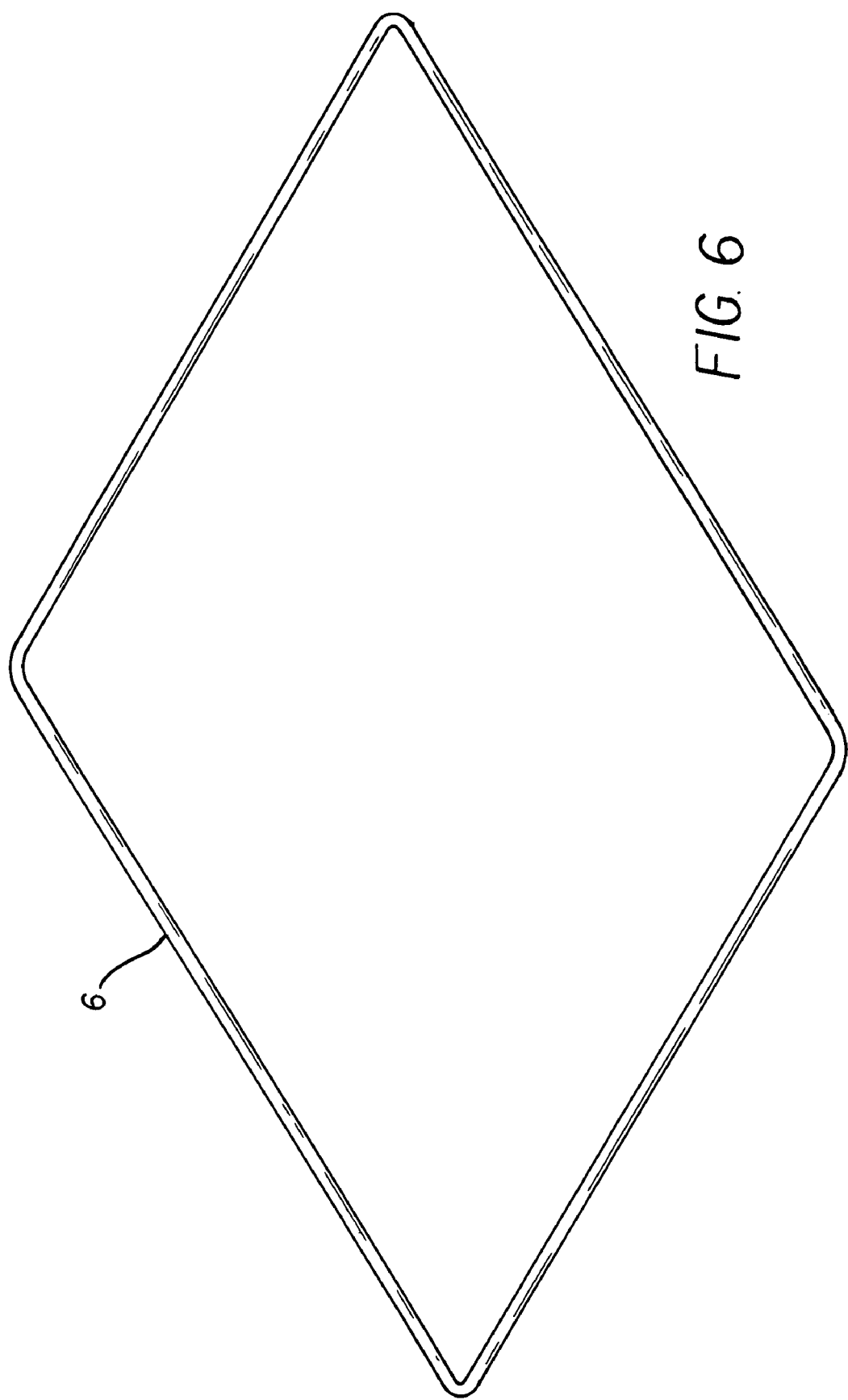
FIG. 6 shows a simple wire frame that can be used to enhance rigidity of the folded donor sheet edges.

FIG. 6 shows wire frame 6 which can be used to enhance the rigidity provided by folded edges 4. Wire frame 6 can be made from stock stainless steel dowel rod (or other appropriate stock material) which has the appropriate wire diameter (e.g. 0.060" diameter). The stock material is cut to length and formed into a closed rectangular shape that is sized for use with donor sheet 1. The joined ends of wire frame 6 can be bonded in some appropriate manner (welded, soldered, glued, etc.).

Figure 7:
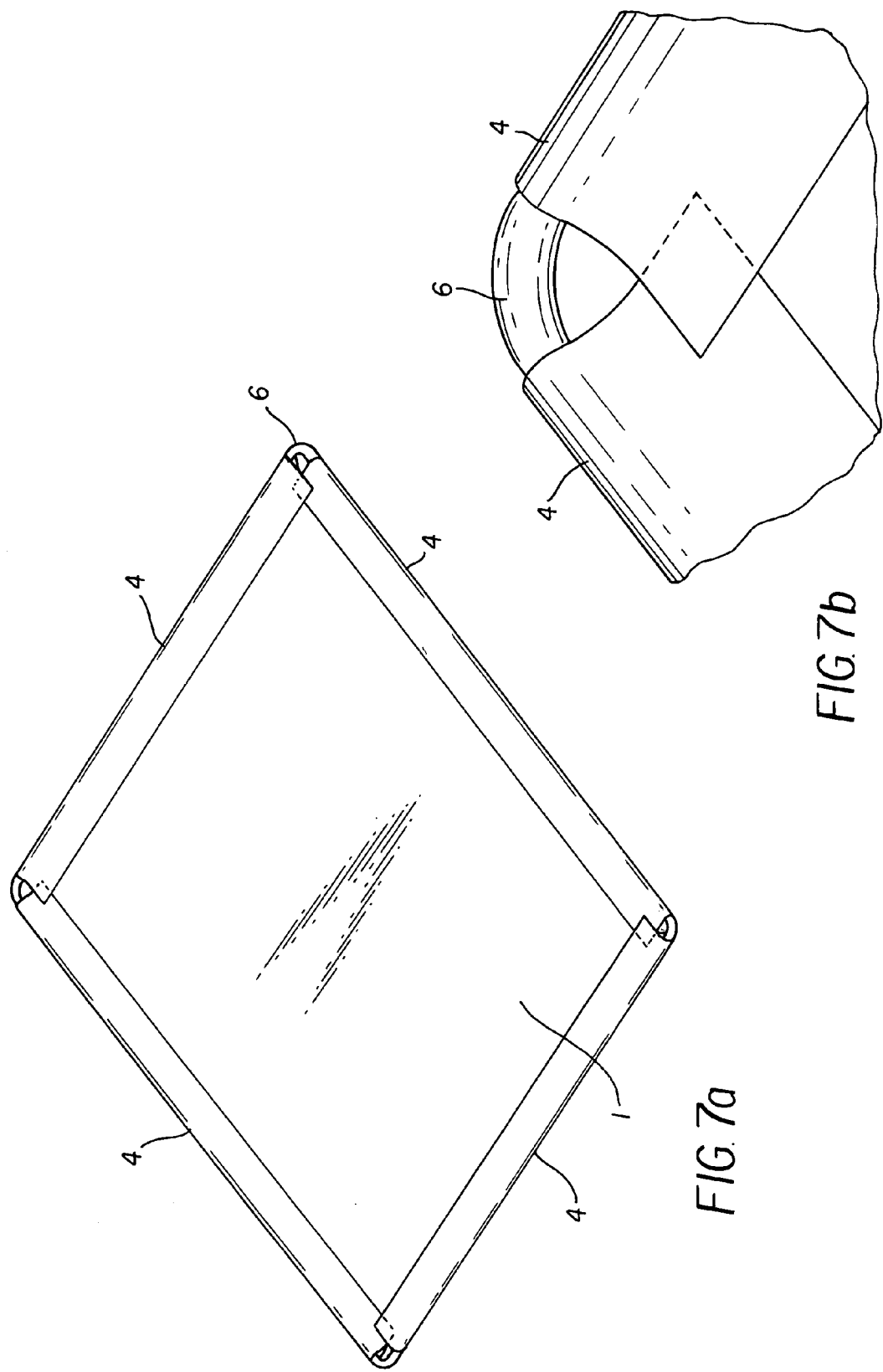

Turning now to FIGS. 7a and 7b where, when wire frame 6 is used, the notched edge portions of the donor sheet 1 are folded about the rigid wire frame 6. The folded edge portions are then secured to the main body of the donor sheet 1. In this arrangement, the folded edge portion in conjunction with the wire frame 6 forms four rigid edges so as to provide a rigid edge frame which can be readily mounted in an OLED device manufacturing process.

Figure 8:
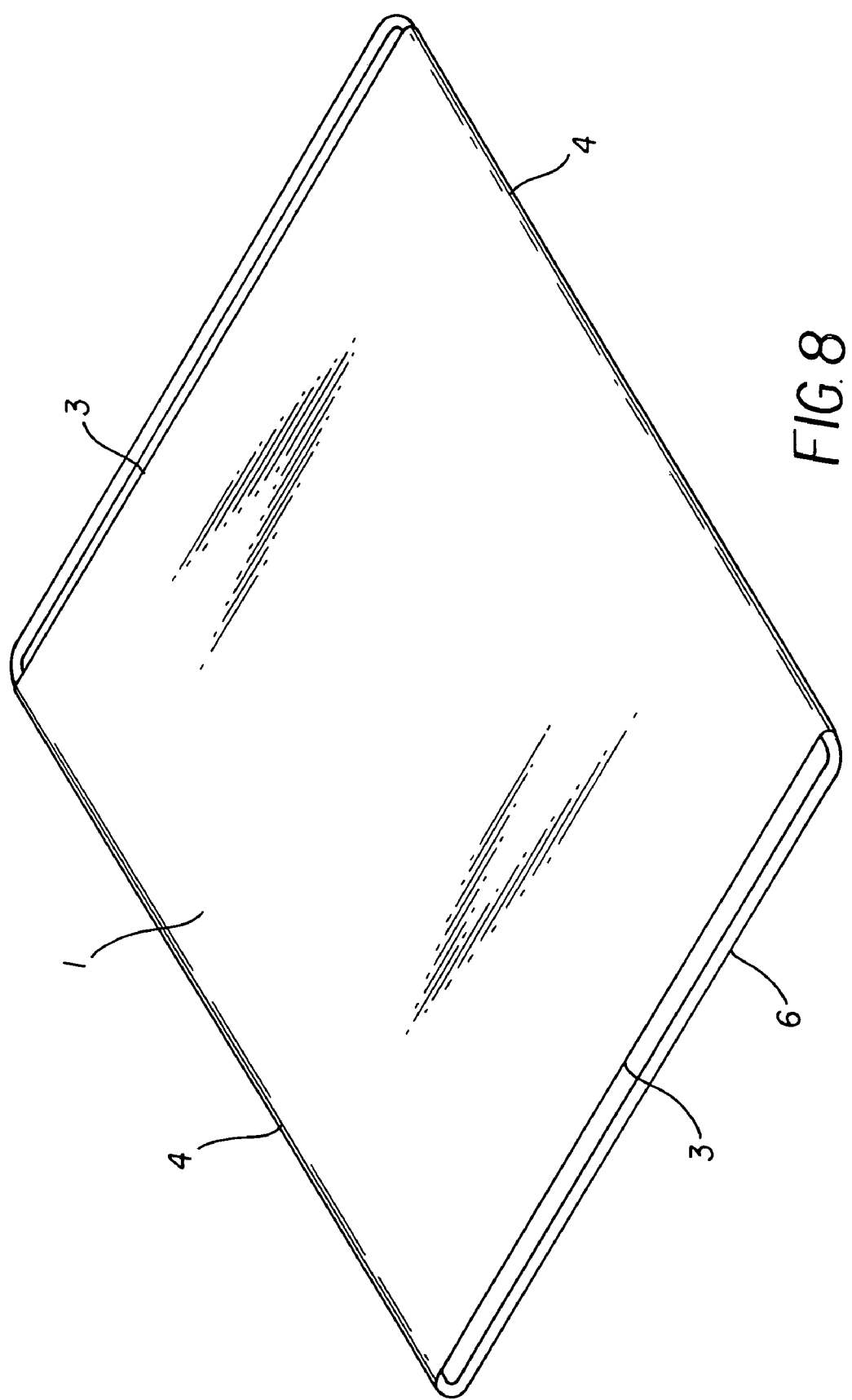
FIG. 8 shows another way a wire frame can be used to enhance the rigidity of the donor sheet.

FIG. 8 shows another embodiment of the invention where wire frame 6 provides enhanced rigidity along two folded edges 4, and supplies all of the rigidity along the remaining two edges 3 which are not folded.

The invention has been described in detail with particular reference to certain preferred embodiments thereof, but it will be understood that variations and modifications can be effected within the spirit and scope of the invention.

PARTS LIST 1 donor sheet
2 notched corner
3 edge
4 folded edge
5 attachment zone
6 wire frame

The invention claimed is:

1. A method of using a flexible donor sheet with organic material for forming an organic layer in an OLED device, comprising:
 a) cutting notches in each of the four corners of the sheet;
 b) folding the four notched edge portions of the sheet and securing the folded portions to the main body of the sheet to form at least four rigid edges so as to provide a rigid edge frame; and
 c) mounting the rigid edge frame and transferring the organic material from the sheet to the OLED device.

2. The method according to claim 1 wherein securing the folded portions to the main body of the sheet is accomplished by adhesives, double-sided tapes, thermal or mechanical fastening.

3. A method of using a flexible donor sheet with organic material for forming an organic layer in an OLED device, comprising:
 a) cutting notches in each of the four corners of the sheet;
 b) providing a rigid wire frame which corresponds to the edge of the sheet;
 c) folding at least two notched edge portions of the sheet about the rigid wire frame and securing the folded portion to the main body of the sheet to form four rigid edges so as to provide a rigid edge frame; and
 d) mounting the rigid edge frame and transferring the organic material from the sheet to the OLED device.

4. The method according to claim 3 further including folding at least four notched edge portions of the sheet about the rigid wire frame.

5. The method according to claim 3 wherein securing the folded portions to the main body of the sheet is accomplished by adhesives, double-sided tapes, thermal or mechanical fastening.

* * * * *

UNITED STATES PATENT AND TRADEMARK OFFICE
CERTIFICATE OF CORRECTION

PATENT NO. : 7,238,252 B2  Page 1 of 1
APPLICATION NO. : 10/790995
DATED : July 3, 2007
INVENTOR(S) : Bradley A. Phillips It is certified that error appears in the above-identified patent and that said Letters Patent is hereby corrected as shown below:

| | |
|---|---|
| Title Page, Column 1 - title | Please replace the title "Method of Forming A Oled Donor Sheet Having Rigid Edge Frame" with the following corrected text: --Method of Forming Oled Donor Sheet Having Rigid Edge Frame-- |
| Column 1 - title | Please replace the title "Method of Forming A Oled Donor Sheet Having Rigid Edge Frame" with the following corrected text: --Method of Forming Oled Donor Sheet Having Rigid Edge Frame-- |

Signed and Sealed this

Eleventh Day of March, 2008

JON W. DUDAS
*Director of the United States Patent and Trademark Office*